United States Patent [19]
Kane

[11] Patent Number: 5,432,407
[45] Date of Patent: Jul. 11, 1995

[54] FIELD EMISSION DEVICE AS CHARGE TRANSPORT SWITCH FOR ENERGY STORAGE NETWORK

[75] Inventor: Robert C. Kane, Woodstock, Ill.

[73] Assignee: Motorola, Inc., Schaumburg, Ill.

[21] Appl. No.: 871,604

[22] Filed: Apr. 20, 1992

Related U.S. Application Data

[63] Continuation of Ser. No. 633,820, Dec. 26, 1990, abandoned.

[51] Int. Cl.⁶ .............................................. H05B 37/00
[52] U.S. Cl. .................................... 315/169.1; 315/58
[58] Field of Search ............... 313/306, 309, 310, 336; 315/169.1, 169.3, 58

[56] References Cited

U.S. PATENT DOCUMENTS

| | | | |
|---|---|---|---|
| 3,755,704 | 8/1973 | Spindt et al. | 313/309 |
| 3,789,471 | 2/1974 | Spindt et al. | 29/25.17 |
| 3,812,559 | 5/1974 | Spindt et al. | 29/25.18 |
| 3,816,794 | 6/1974 | Snyder | 315/194 |
| 3,894,265 | 7/1975 | Holmes et al. | 315/194 |
| 3,984,757 | 10/1976 | Gott et al. | 315/268 |
| 4,190,790 | 2/1980 | Plumb et al. | 315/294 |
| 4,594,630 | 6/1986 | Rabinowitz et al. | 313/310 |
| 4,721,885 | 1/1988 | Brodie | 313/576 |
| 4,827,177 | 5/1989 | Lee et al. | 313/306 |
| 4,853,600 | 8/1989 | Zettner et al. | 315/152 |
| 4,874,981 | 10/1989 | Spindt | 313/309 |
| 4,965,509 | 10/1990 | Oldham | 315/194 |
| 5,012,153 | 4/1991 | Atkinson et al. | 313/309 |

FOREIGN PATENT DOCUMENTS

| | | |
|---|---|---|
| 0172089 | 7/1985 | European Pat. Off. . |
| 2604823 | 10/1986 | France . |
| 2204991 | 11/1988 | United Kingdom . |
| 855782 | 6/1977 | U.S.S.R. . |

OTHER PUBLICATIONS

Streetman, "Solid State Electronic Devices", 2nd edition, Prentice-Hall, Inc., copyright 1980, p. 413.

A Vacuum Field Effect Transistor Using Silicon Field Emitter Arrays, by Gray, 1986 IEDM.

Advanced Technology: flat cold-cathode CRTs, by Ivor Brodie, Information Display, Jan. 1989.

Field-Emitter Arrays Applied to Vacuum Flourescent Display, by Spindt et al., Jan., 1989 issue of IEEE Transactions on Electronic Devices.

Field Emission Cathode Array Development for High--Current Density Applications by Spindt et al., dated Aug. 1982, vol. 16 of Applications of Surface Science.

*Primary Examiner*—Robert J. Pascal
*Assistant Examiner*—Michael B. Shingleton
*Attorney, Agent, or Firm*—Eugene A. Parsons

[57] ABSTRACT

An energy storage circuit employing an energy storage network and a field emission device charge transport switch is provided. Utilization of various configurations of FEDs in the energy storage circuit provides for performance enhancement of addressing of display devices including liquid crystal displays, electroluminescent displays, and cathodoluminescent displays employing FED electron sources.

13 Claims, 3 Drawing Sheets

FIELD EMISSION DEVICE AS CHARGE TRANSPORT SWITCH FOR ENERGY STORAGE NETWORK

This application is a continuation of prior application Ser. No. 07/633,820, filed Dec. 26, 1990, now abandoned.

This application is related to the co-pending application: *A Bi-Directional Field Emission Device*; Robert C. Kane, Inventor; Motorola, Inc., Assignee; Ser. No. 07/621,186 Filed Nov. 30, 1990.

TECHNICAL FIELD

This invention relates generally to cold-cathode field emission devices and more particularly to field emission devices employed as charge transport control elements for energy storage networks.

BACKGROUND OF THE INVENTION

Electron devices employed as charge transport switches are known in the art. Such devices are frequently utilized to control the movement of energy, in the form of charge carriers such as electrons, to or from a charge storage network such as a capacitive network. Further, present applications generally require that charge transport devices conform to the restrictions imposed by integrated circuit concepts.

Prior art electron devices fulfilling the needs detailed above have generally been realized as semiconductor devices wherein charge transport is effected in a semiconductor material. This charge transport environment imposes a number of impediments to optimum performance. A first impediment is that realization of the semiconductor devices is a complex process, and is not conveniently implemented in concert with other technologies such as flat displays. A second impediment is that, in an attempt to minimize the difficulties of the first impediment, polycrystalline and amorphous semiconductor materials are often used to realize the charge transport devices. Such devices typically suffer from reduced carrier mobility, which limits the applications in which this technique may be employed.

Therefore, there exists a need for a charge transport device which overcomes at least some of the shortcomings of the prior art.

SUMMARY OF THE INVENTION

This need and others are substantially met through provision of an energy storage circuit comprising at least an energy storage network, wherein the energy storage network is comprised of at least a first capacitive element; and a bi-directional field emission device (FED) operably connected to the energy storage network, the bi-directional FED comprising at least: a plurality of anode/emitter electrodes and at least a first gate extraction electrode, wherein at least a first of the plurality of anode/emitter electrodes is operably coupled to the energy storage network.

DETAILED DESCRIPTION OF A PREFERRED EMBODIMENT

Figure 1:
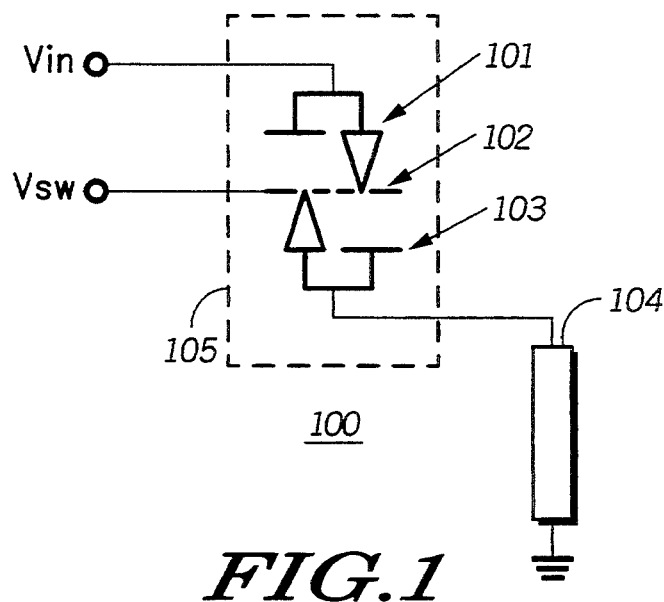
FIG. 1 provides a schematic diagram of a first embodiment of an energy storage circuit in accordance with the present invention.

FIG. 1, numeral 100, illustrates schematically a first embodiment of an energy storage circuit in accordance with the present invention, setting forth a schematic of a bi-directional FED (105) comprised of at least a first anode/emitter electrode (101), at least a second anode/emitter electrode (103), and at least a first gate extraction electrode (102). As shown, the at least first anode/emitter electrode (101) functions as an input electrode of the bi-directional FED (105), and will receive an input voltage, designated as $V_{in}$. The at least second anode/emitter electrode (103) is operably coupled to an energy storage network (104), and will function as an output electrode for the energy storage circuit. Energy storage networks are known in the art, and may include, but are not limited to, passive circuit elements such as capacitors and inductors. The at least first gate extraction electrode (102) will receive a switching signal, $V_{sw}$. When $V_{sw}$ is applied to the at least first gate extraction electrode (102) of the bi-directional FED (105), the energy storage circuit is in an active mode, and the input signal, $V_{in}$, which is present at the at least first anode/emitter electrode (101) will cause charge carriers to flow either to/from the energy storage network (104) depending on a magnitude of $V_{in}$ with respect to a voltage produced by an amount of energy stored in the energy storage network (104).

If $V_{in}$ is less than the voltage at the energy storage network (104), charge carriers (electrons) will flow into the energy storage network (104) until the voltage corresponding to the energy stored in the energy storage network (104) is substantially the same as that of $V_{in}$. This transport of charge carriers into the energy storage network (104) constitutes an increase in the amount of stored energy. For the case described, the at least first anode/emitter electrode (101) will function as an emitter electrode while the at least second anode/emitter electrode (103) will function as an anode electrode to collect at least some of the electrons emitted by the at least first anode/emitter electrode (101).

When the input voltage, $V_{in}$, is greater than the voltage at the energy storage network (104), application of $V_{sw}$ causes reversal of charge carrier direction for the bi-directional FED (105), and charge carriers (electrons) will flow out of the energy storage network (104) through the bi-directional FED (105). This transport of charge carriers out of the energy storage network (104) constitutes a decrease in stored energy. For this case, the at least second anode/emitter electrode (103) will function as an emitter electrode, while the at least first anode/emitter electrode (101) will function as an anode electrode to collect at least some of the electrons emitted by the at least second anode/emitter electrode (103).

Therefore, operating as described, energy stored in the energy storage network (104) is effectively determined by the input voltage, $V_{in}$, and the switching voltage, $V_{sw}$, received by the bi-directional FED (105). In the absence of an appropriate switching voltage, the presence of an input voltage will have no impact on the energy stored in the energy storage network (104) since the bidirectional FED (105) will be in an inactive mode.

Figure 2:
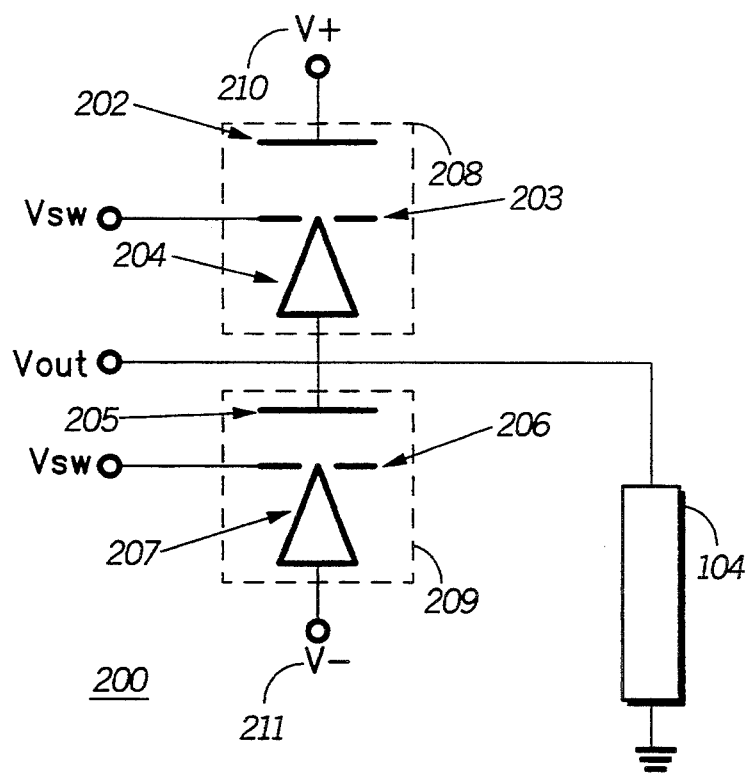
FIG. 2 provides a schematic diagram of a second embodiment of an energy storage circuit in accordance with the present invention.

FIG. 2 provides a schematic representation of a second embodiment of an energy storage circuit in accordance with the present invention, setting forth a schematic of at least first and second FEDs (208, 209)(hereafter, for FIG. 2, referred as the first FED and the second FED), each FED comprised of at least an emitter electrode (204, 207), at least an anode electrode (202, 205), and at least a first gate extraction electrode (203, 206), that are employed to provide a path for transport of charge carriers (electrons) to/from an energy storage network (104). The emitter electrode (204) of the at least first FED (208) and the anode electrode (205) are operably coupled to each other and to the energy storage network (104). The gate extraction electrodes (203, 206) of the at least first and the at least second FED (208, 209) receive a first and a second switching voltage ( $V_{sw1}$, $V_{sw2}$), independently, and independently "place the at least first/the at least second FED (208, 209) in an", thereby deleting the space after the slash active mode. By providing suitable potentials to the anode electrode (202) of the at least first FED (208) and the emitter electrode (207) of the at least second FED (209), charge carrier transport will take place, and energy is added to/withdrawn from the energy storage network (104).

In the instance when a predetermined first switching voltage ($V_{sw1}$) is applied to the gate extraction electrode (203) of the first FED (208), the first FED (208) enters an active mode, and charge carriers are removed from the energy storage network (104) when a V+ voltage (210) is greater than a voltage corresponding to an energy stored in the energy storage network (104). Removal of charge carriers from the energy storage network (104) through the first FED (208) constitutes a reduction in stored energy, and results in a corresponding increase in voltage (less negative) at the energy storage network (104).

Alternatively, when a predetermined second switching voltage ($V_{sw2}$) is applied to the gate extraction electrode (206) of the second FED (209), the second FED (209) enters the active mode, and charge carriers are added to the energy storage network (104) when a V− voltage (211) is less than a voltage corresponding to an energy stored in the energy storage network (104). Addition of charge carriers to the energy storage network (104) through the second FED (209) constitutes an increase in stored energy, and results in a corresponding reduction in voltage (more negative) at the energy storage network (104).

Determination as to which FED of the first or second FEDs (208 or 209) is to be energized, and whether or not the voltage at the energy storage network (104) has reached a desired value may be made by monitoring the voltage at the energy storage network (104) as indicated by $V_{out}$ in FIG. 2.

Figure 3:
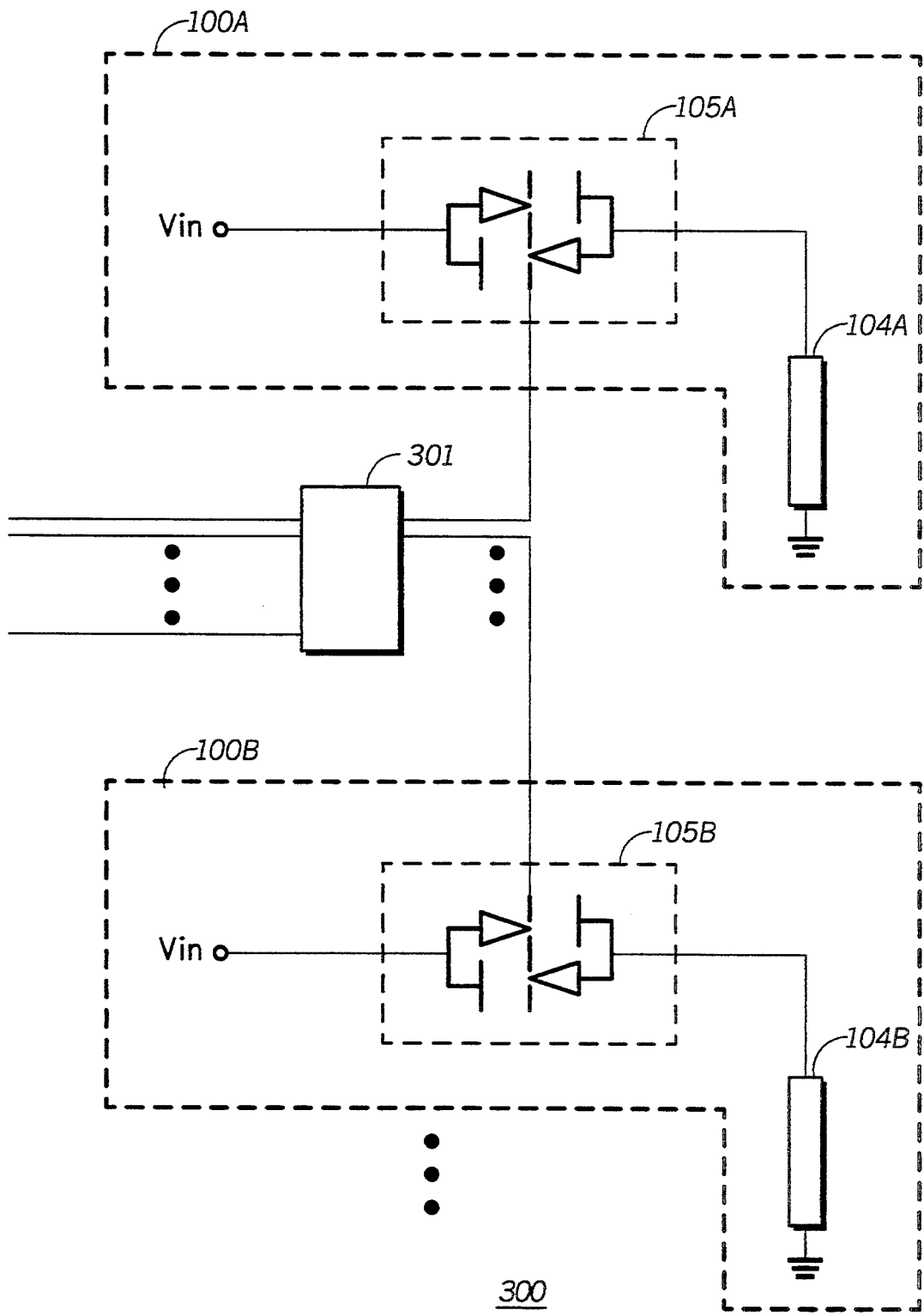
FIG. 3 provides a schematic diagram of a first embodiment of an electronic circuit employing energy storage circuits in accordance with the present invention.

FIG. 3, numeral 300, provides a schematic representation of a first embodiment of an electronic circuit in accordance with the present invention employing a plurality of energy storage circuits (100A, 100B, . . . ). Each of a plurality of bi-directional FEDs (105A, 105B, . . . ) is operably coupled to at least a first of a plurality of energy storage networks (104), wherein the bi-directional FEDs (105A, 105B, . . . ) and energy storage networks (104) operate as described above with reference to FIG. 1. Additionally, FIG. 3 depicts a switching logic network (301) of the electronic circuit with a plurality of input and output lines. Each of at least some of the plurality of output lines of the switching logic network (301) is independently connected to a gate extraction electrode of at least a first of the plurality of bi-directional FEDs (105A, 105B, . . . ). The switching logic network (301) may be realized by any of many commonly known techniques including, but not limited to, active and passive networks, including discrete and integrated circuitry employing transistors, gates, registers, and switches. Control and timing signals that are received via at least some of the input lines of the switching logic network (301) are employed by the switching logic network (301) in determining which of the bi-directional FEDs (105A, 105B, . . . ) of the plurality of energy storage circuits (104A, 104B, . . . ) of the electronic circuit (300) will be active. Although FIG. 3 depicts an electronic circuit with two energy storage circuits (100A, 100B), it is clear that realization of electronic circuits employing increased multiplicity of energy storage circuits is included accordance with the present invention. Voltage inputs ($V_{in1}$, $V_{in2}$, . . . ) for each of the bi-directional FEDs are selectable.

Figure 4:
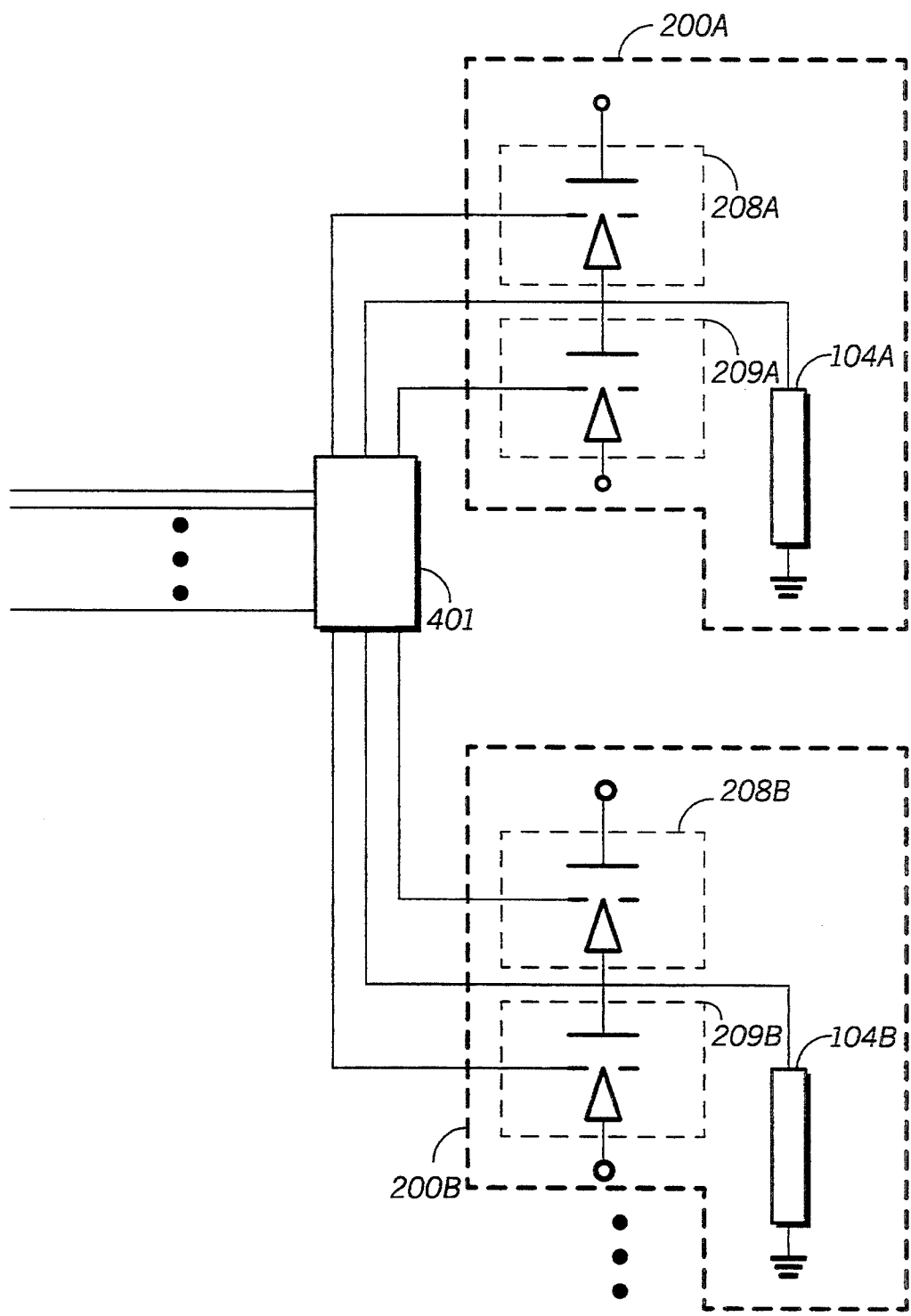
FIG. 4 provides a schematic diagram of a second embodiment of an electronic circuit employing energy storage circuits in accordance with the present invention.

FIG. 4 provides a schematic diagram of a second embodiment of an electronic circuit (400) comprising a plurality of energy storage circuits (200A, 200B . . . ) and a switching logic network (401) in accordance with the present invention. Each of the plurality of energy storage circuits (200A, 200B, . . . ) operates as described above with reference to FIG. 2. The switching logic network (401) operates substantially in a same manner as the switching logic network (301) described above with reference to FIG. 3. Although FIG. 4 depicts an electronic circuit with two energy storage circuits, it is anticipated that realization of electronic circuits employing increased multiplicity of energy storage circuits may be possible.

Pursuant to this invention, an energy storage element such as, for example, a capacitor and(or) the capacitance associated with a liquid crystal picture element, may be caused to increase or decrease in the amount of stored energy by means of electron transport through one or more FEDs operably coupled to the capacitance.

Accordingly, an energy storage circuit is comprised of at least a first bi-directional FED and an energy storage network, which energy storage network is comprised of at least a capacitive element and is operably coupled to the at least first bi-directional FED.

Charge carrier transport in the FED is in free space and does not suffer from carrier mobility reduction of bulk semiconductor materials. The high carrier mobility of the FED allows display devices employing energy storage elements to operate at higher switching rates than can presently be achieved with semiconductor switching devices. Further, the energy storage network employing an FED may be realized as a series of simple depositions and etch steps that are entirely compatible with most flat display technologies.

The electronic circuits described above will find utility as a mechanism for providing activation voltages that correspond to stored energy in energy storage networks, to attendant display picture elements such as liquid crystal pixels, electroluminescent pixels, and cathodoluminescent pixel elements employing FED electron sources.

I claim:

1. An energy storage circuit comprising:

an energy storage network including a capacitive element;

a bi-directional field emission device including a gate extraction electrode connected to the energy storage network so that charge carriers flow through the bi-directional field emission device and into the capacitive element in a first operating mode and charge carriers flow out of the capacitive element and through the bi-directional field emission device in a second operating mode, the first and second operating modes being determined by a voltage applied to the gate extraction electrode.

2. An energy storage circuit comprising:

an energy storage network including a capacitive element;

a bi-directional field emission device connected to the energy storage network, the bi-directional field emission device including an anode/emitter electrode and an emitter/anode electrode, selectively distally disposed with respect to each other and geometrically continuously formed such that one of the anode/emitter electrode and the emitter/anode electrode functions as an emitter electrode for emitting electrons and the other of the anode/emitter electrode and the emitter/anode electrode functions as an anode electrode for collecting at least some of the electrons emitted by the emitter electrode in a first operating mode, and the one of the anode/emitter electrode and the emitter/anode electrode functions as an anode electrode for collecting at least some of the electrons emitted by the emitter electrode and the other of the anode/emitter electrode and the emitter/anode electrode functions as an emitter electrode for emitting electrons in a second operating mode, and a gate extraction electrode, electrically associated with the one of the anode/emitter electrode and the emitter/anode electrode functioning as an emitter electrode in each of the first and second modes, for modulating the rate of electron emission from the emitter electrode in each of the first and second modes, the gate extraction electrode being proximally disposed in the intervening region between the anode/emitter electrode and the emitter/anode electrode such that reciprocal electron flow is selectably achieved within the bi-directional field emission device; and the bi-directional field emission device being connected to the energy storage network so that charge carriers flow through the bi-directional field emission device and into the capacitive element in the first operating mode and charge carriers flow out of the capacitive element and through the bi-directional field emission device in the second operating mode, the first and second operating modes being determined by a voltage applied to the gate extraction electrode.

3. An energy storage circuit as claimed in claim 2 further comprising a switching logic network coupled to the gate extraction electrode.

4. An energy storage circuit as claimed in claim 2 further comprising a plurality of bi-directional field emission devices and a plurality of energy storage networks, one each of the plurality of energy storage networks being coupled to one each of the plurality of bi-directional field emission devices.

5. An energy storage circuit as claimed in claim 2 wherein the capacitive element includes a liquid crystal display pixel.

6. An energy storage circuit in electronic apparatus comprising:

a plurality of energy storage networks, each network including a capacitive element;

a supporting substrate; and a plurality of bi-directional field emission devices one each connected to one each of the plurality of energy storage networks, each of the plurality of bi-directional field emission devices including an anode/emitter electrode and an emitter/anode electrode, selectively distally disposed with respect to each other on the supporting substrate and geometrically continuously formed such that one of the anode/emitter electrode and the emitter/anode electrode functions as an emitter electrode for emitting electrons and the other of the anode/emitter electrode and the emitter/anode electrode functions as an anode electrode for collecting at least some of the electrons emitted by the emitter electrode in a first operating mode, and the one of the anode/emitter electrode and the emitter/anode electrode functions as an anode electrode for collecting at least some of the electrons emitted by the emitter electrode and the other of the anode/emitter electrode and the emitter/anode electrode functions as an emitter electrode for emitting electrons in a second operating mode, a gate extraction electrode, electrically associated with the one of the anode/emitter electrode and the emitter/anode electrode functioning as an emitter electrode in each of the first and second operating modes, for modulating the rate of electron emission from the emitter electrode in each of the first and second operating modes, the gate extraction electrode being proximally disposed in the intervening region between the anode/emitter electrode and the emitter/anode electrode such that reciprocal electron flow is selectably achieved within the bi-directional field emission device, and the bi-directional field emission device being connected to the energy storage network so that charge carriers flow through the bi-directional field emission device and into the capacitive element in the first operating mode and charge carriers flow out of the capacitive element and through the bi-directional field emission device in the second operating mode, the first and second operating modes being determined by a voltage applied to the gate extraction electrode.

7. An energy storage circuit as claimed in claim 6 wherein the capacitive element in each of the plurality of energy storage networks includes a liquid crystal display pixel.

8. An energy storage circuit in electronic apparatus as claimed in claim 7 wherein the energy storage networks are formed as a part of the supporting substrate.

9. An energy storage circuit comprising:

an energy storage network including a capacitive element;

first and second field emission devices, each field emission device including an anode, a gate extraction electrode and an emitter; and the emitter of the first field emission device being coupled to the anode of the second field emission device and to the energy storage network so that charge carriers flow through the second field emission device and into the capacitive element in a first operating mode and charge carriers flow out of the capacitive element and through the first field emission device in a second operating mode, the first and second operating modes being determined by voltages applied to the gate extraction electrodes of the first and second field emission devices.

10. An energy storage circuit as claimed in claim 9 further comprising a switching logic network coupled to the gate extraction electrodes of the first and second field emission devices.

11. An energy storage circuit as claimed in claim 9 further comprising a plurality of first and second field emission devices and a plurality of energy storage networks, one each of the plurality of energy storage networks being coupled to one each of the plurality of first and second field emission devices.

12. An energy storage circuit as claimed in claim 11 wherein each capacitive element included in each of the plurality of energy storage networks includes a liquid crystal display pixel.

13. An energy storage circuit in electronic apparatus as claimed in claim 9 including in addition a supporting substrate with the first and second field emission devices being formed as a part of the supporting substrate.

* * * * *